(12) United States Patent
Burrows et al.

(10) Patent No.: US 8,912,018 B2
(45) Date of Patent: Dec. 16, 2014

(54) MANUFACTURING FLEXIBLE ORGANIC ELECTRONIC DEVICES

(71) Applicant: Universal Display Corporation, Ewing, NJ (US)

(72) Inventors: Paul E. Burrows, Chattaroy, WA (US); Ruiqing Ma, Morristown, NJ (US)

(73) Assignee: Universal Display Corporation, Ewing, NJ (US)

( * ) Notice: Subject to any disclaimer, the term of this patent is extended or adjusted under 35 U.S.C. 154(b) by 0 days.

(21) Appl. No.: 13/716,833

(22) Filed: Dec. 17, 2012

(65) Prior Publication Data

US 2014/0170787 A1    Jun. 19, 2014

(51) Int. Cl.
*H01L 51/52* (2006.01)
*H01L 21/52* (2006.01)
*H01L 23/28* (2006.01)

(52) U.S. Cl.
CPC ..... *H01L 51/5246* (2013.01); *H01L 2251/5338* (2013.01)
USPC ................... 438/27; 438/82; 438/99; 257/40; 257/100; 257/678; 313/498

(58) Field of Classification Search
CPC . H01L 51/0097; H01L 51/5246; H01L 51/56; H01L 2251/5338; H01L 2924/12044
See application file for complete search history.

(56) References Cited

U.S. PATENT DOCUMENTS

| | | | |
|---|---|---|---|
| 4,769,292 A | 9/1988 | Tang | |
| 5,247,190 A | 9/1993 | Friend | |
| 5,703,436 A | 12/1997 | Forrest | |
| 5,707,745 A | 1/1998 | Forrest | |
| 5,834,893 A | 11/1998 | Bulovic | |
| 5,844,363 A | 12/1998 | Gu | |
| 6,013,982 A | 1/2000 | Thompson | |
| 6,087,196 A | 7/2000 | Sturm | |
| 6,091,195 A | 7/2000 | Forrest | |
| 6,097,147 A | 8/2000 | Baldo | |
| 6,294,398 B1 | 9/2001 | Kim | |

(Continued)

FOREIGN PATENT DOCUMENTS

| | | |
|---|---|---|
| WO | 2008057394 | 5/2008 |
| WO | 2010011390 | 1/2010 |

OTHER PUBLICATIONS

Baldo, et al., "Highly Efficient Phosphorescent Emission fromOrganic Electroluminescent Devices," Nature, Sep. 10, 1998, 4 pp., Macmillan Publishers Ltd., London, UK.

(Continued)

*Primary Examiner* — Zandra Smith
*Assistant Examiner* — Pamela E Perkins
(74) *Attorney, Agent, or Firm* — Morris & Kamlay LLP

(57) ABSTRACT

A method of making a flexible organic electronic device includes forming a first portion including a first flexible substrate, wherein the first portion is formed under a first set of conditions to provide a barrier system, separately forming a second portion comprising at least one organic electronic device region deposited upon a second flexible substrate, wherein the second portion is formed under a second set of conditions, different from the first set of conditions, and placing the first portion over the second portion (although not necessarily in contact therewith) to cover the organic electronic device region. The organic electronic device region is not placed in physical contact with another solid material before placing the first portion over the second portion.

55 Claims, 9 Drawing Sheets

(56) References Cited

U.S. PATENT DOCUMENTS

| | | |
|---|---|---|
| 6,303,238 B1 | 10/2001 | Thompson |
| 6,337,102 B1 | 1/2002 | Forrest |
| 6,468,819 B1 | 10/2002 | Kim |
| 6,866,901 B2 | 3/2005 | Burrows |
| 7,198,832 B2 | 4/2007 | Burrows |
| 7,279,704 B2 | 10/2007 | Walters |
| 7,431,968 B1 | 10/2008 | Shtein |
| 7,727,601 B2 | 6/2010 | Burrows |
| 7,968,146 B2 | 6/2011 | Wagner |
| 2003/0230980 A1 | 12/2003 | Forrest |
| 2004/0031977 A1* | 2/2004 | Brown et al. ............. 257/222 |
| 2004/0174116 A1 | 9/2004 | Lu et al. |
| 2006/0180197 A1* | 8/2006 | Gui et al. ............. 136/255 |
| 2006/0226523 A1* | 10/2006 | Foust et al. ............. 257/680 |
| 2008/0185701 A1* | 8/2008 | Foust et al. ............. 257/682 |
| 2011/0315972 A1* | 12/2011 | Takahashi et al. ............. 257/40 |

OTHER PUBLICATIONS

Baldo, et al., "Very high-efficiency green organic light-emitting devices based on electrophosphorescence," Applied Physics Letters, Jul. 5, 1999, 4 pp., vol. 75, No. 1, American Institute of Physics, Melville, NY, USA.

Nielsen, Lawrence E., Models for the Permeability of Filled Ploymer Systems, J. Macromol. Sci. (Chem.), A1(5), pp. 929-941 (1967), downloaded by Princetown University at 12:24 Sep. 16, 2013.

* cited by examiner

MANUFACTURING FLEXIBLE ORGANIC ELECTRONIC DEVICES

The claimed invention was made by, on behalf of, and/or in connection with one or more of the following parties to a joint university corporation research agreement: Regents of the University of Michigan, Princeton University, The University of Southern California, and the Universal Display Corporation. The agreement was in effect on and before the date the claimed invention was made, and the claimed invention was made as a result of activities undertaken within the scope of the agreement.

FIELD

A number of embodiments hereof relate to organic electronic devices including organic light-emitting diode devices, systems and methods.

BACKGROUND

The following information is provided to assist the reader in understanding technologies disclosed below and the environment in which such technologies may typically be used. The terms used herein are not intended to be limited to any particular narrow interpretation unless clearly stated otherwise in this document. References set forth herein may facilitate understanding the technologies the background thereof. The disclosure of all references cited herein are incorporated by reference.

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using International Commission on Illumination (CIE) coordinates, which are well known to the art.

One example of a green emissive molecule is tris(2-phenylpyridine) iridium, denoted $Ir(ppy)_3$, which has the following structure:

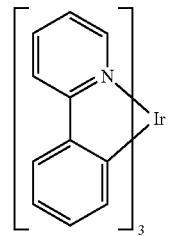

In this structure, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein in referencing elements "disposed above" a device side of the substrate, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between. In the case of elements "disposed under" the substrate (that is, on a side opposite the devices side of the substrate), when a first layer is described as "disposed under" a second layer, the first layer is disposed further away from substrate than the second layer. Once again, there may be other layers between the first and second layer, unless it is specified that the first layer is "in contact with" the second layer.

As used herein, "solution processible" means capable of being dissolved, dispersed, or transported in and/or deposited from a liquid medium, either in solution or suspension form.

More details on OLEDs, and the definitions described above, can be found in U.S. Pat. No. 7,279,704, which is incorporated herein by reference in its entirety.

Most rigid OLEDs are formed on a glass substrate and encapsulated with a glass or metal plate, sealed around the edge with a bead of adhesive such as UV-curable epoxy. Some work has been published on flexible displays encapsulated with a thin film moisture barrier deposited directly on top of the OLED. In those cases, the barrier is either an inorganic thin film or a composite organic-inorganic multilayer stack. Organic-inorganic stacks are particularly good at covering particulate defects on the OLED surface (however, at the expense of a longer TAC time and more complex material structure).

In all cases, one of the limitations of barrier quality is the inability to utilize high energy and/or high temperature processes to, for example, densify the barrier layers without damaging the OLED. While plastic substrates such as polyethylene terephthalate, polyethylene naphthalate, polyether sulfone etc. also have limits to their processing temperature, the OLED grown on such substrates usually has even a lower limit. Although a bare substrate may not be adversely affected by high energy and/or oxidative processes such as plasma exposure; such high energy or oxidative processes would severely damage an OLED.

BRIEF SUMMARY

In one aspect, a method of making a flexible organic electronic device includes forming a first portion including a first flexible substrate, wherein the first portion is formed under a first set of conditions to provide a barrier system, separately forming a second portion comprising at least one organic electronic device region deposited upon a second flexible substrate, wherein the second portion is formed under a second set of conditions, different from the first set of conditions, and placing the first portion over the second portion (although not necessarily in contact therewith) to cover the organic electronic device region. The organic electronic device region is not placed in physical contact with another solid material before placing the first portion over the second portion. One or more sealing engagements may be made (for example, between the first portion and the second portion or between the first portion and another component) such that the first portion provides a sealing encapsulation of the at least the organic electronic device region(s). The flexible organic electronic device may, for example, be a flexible organic light emitting diode device.

In a number of embodiments, the organic electronic device region is formed in a roll-to-roll process. The first portion may be in motion and the second portion may be in motion when the first portion is attached to the second portion. In a number of embodiments, the first portion is placed over the second portion in a roll-to-roll process.

The second flexible substrate may, for example, be a metal foil. The second flexible substrate may, for example, include a polymer or a barrier coated polymer.

The organic electronic device region may, for example, further comprise a top protective layer.

In a number of embodiments, there is no exposure of the first portion to ambient atmosphere between the time of formation thereof and a time of placing the first portion over the second portion and forming a sealing encapsulation of the organic electronic device region. The first portion and the second portion may, for example, be transported for placing the first portion over the second portion in an inert atmosphere. The first portion and the second portion may, for example, be transported for placing the first portion over the second portion in a vacuum. The organic electronic device region may, for example, be deposited upon the second flexible substrate and the first portion may be placed over the second portion without breaking vacuum. In a number of embodiments, the organic electronic device region is deposited upon the second flexible substrate and the first portion is placed over the second portion in the same vacuum chamber.

In a number of embodiments, at least one condition of the first set of conditions would damage at least one layer of the organic electronic device region. The first set of conditions may, for example, include at least one of a high energy condition, an oxidative condition or a high temperature condition. A temperature condition of the first set of conditions may, for example, exceed a temperature 10 degrees below the glass transition temperature of at least one organic material of the second portion or exceed that glass transition temperature. Formation of the first portion may, for example, include a plasma process.

In a number of embodiments, a plurality of spaced organic electronic device regions are deposited on the second flexible substrate such that the first portion and second portion can be cut to form individual organic electronic devices (including one or more organic electronic device regions) having a determined outer perimeter. The method may, for example, further include applying a face seal over a surface of the first portion to be attached to the second portion so that substantially the entire surface of the first portion to be attached to the second portion is covered generally uniformly by the face seal. Attaching the first portion to the second portion may, for example, include applying pressure. The method may further include curing the face seal. The face seal may, for example, include a flexible adhesive or a metal solder. The flexible adhesive may, for example, include a flexible epoxy. In a number of embodiments, the face seal includes particles to inhibit moisture conduction. The face seal may, for example, have a thickness no greater than 100 µm.

In a number of embodiments, the individual organic electronic devices include a width of flexible substrate between an outer perimeter of the at least one organic electronic device region and the outer perimeter of the individual organic electronic devices. The method may, for example, further include applying an edge seal having a determined width to the first portion, wherein the determined width of the edge seal applied to the first portion is determined such that, after attachment of the first portion to the second portion, an inner perimeter of the edge seal does not contact the organic electronic device region of the individual organic electronic devices. Attaching the first portion to the second portion may include applying pressure. The method may, for example, further include curing the edge seal. The edge seal may, for example, include a flexible adhesive or a metal solder such as a low melting point metal solder (for example, indium or an indium-tin eutectic). The edge seal may, for example, include a flexible epoxy. The edge seal may, for example, include particles to inhibit moisture conduction. In a number of embodiments, the edge seal has a thickness no greater than 100 µm.

In a number of embodiments, the first portion comprises a thin metal layer. In such embodiments, the method may, for example, further include placing a dielectric layer between the thin metal layer and the organic electronic device region.

In a number of embodiments, there is no winding of the second portion around a roller before the first portion is placed over the second portion. In a number of embodiments, the first portion comprises a single layer barrier.

The method may further include forming a third portion comprising a third flexible substrate, wherein the third portion is formed under a third set of conditions, which are different from the second set of conditions, to provide a barrier system, and placing the third portion under the second portion (although not necessarily on contact therewith), opposite a side of the second portion to which the first portion is positioned. There is no exposure of the second portion to ambient atmosphere between the time of formation thereof and the time the third portion is placed thereunder. In a number of embodiments, there is no exposure of the first portion to ambient atmosphere between the time of formation thereof and a time of placing the first portion over the second portion and forming a sealing encapsulation of the organic electronic device region, and there is no exposure of the third portion to ambient atmosphere between the time of formation thereof and a time of placing the third portion under the second portion, opposite a side of the second portion to which the first portion is positioned.

In a number of embodiments, the flexible organic electronic device is a flexible organic light emitting diode device and the method further comprises placing a flexible structure to enhance optical out-coupling between the organic electronic device region and the third portion. The flexible structure to enhance optical out-coupling may, for example, include a microlens array. The microlens array may, for example, be formed using the same material as the second substrate. In a number of embodiments, the flexible structure to enhance optical outcoupling is formed with at least one material having a refractive index not more than 0.1 less than a refractive index of a light-emitting layer of the organic electronic device region. The flexible structure to enhance optical out-coupling may be formed with at least one material having a refractive index greater than a refractive index of a light-emitting layer of the organic electronic device region.

In a number of embodiments, the flexible organic electronic device is a flexible organic light emitting diode device and the method further comprises modifying the substrate to enhance outcoupling thereof.

In a number of embodiments, the method further includes forming a third portion comprising a third flexible substrate, wherein the third portion is formed under a third set of conditions, which are different from the second set of conditions, to provide a barrier system, and sealing the first portion to the third portion to encompass or entrap the second portion therebetween. The second portion may, for example, exhibit insufficient barrier properties. The first portion may, for example, include a single barrier layer on the first flexible substrate.

In another aspect, a method of making a flexible organic electronic device includes forming a first portion including a first flexible substrate, the first portion being formed under a first set of conditions to provide a barrier system, separately forming a second portion including at least one organic electronic device region deposited upon a second flexible substrate, the second portion being formed under a second set of conditions, different from the first set of conditions, placing the first portion over the second portion to cover the organic electronic device region; forming a third portion including a third flexible substrate, the third portion being formed under a third set of conditions, which are different from the second set of conditions, to provide a barrier system; and sealing the first portion to the third portion to entrap the second portion.

In a further aspect, a method of making a flexible organic light emitting diode device includes forming a first portion to provide a first flexible barrier system, separately forming a second portion comprising at least one organic light emitting diode device region deposited upon a second flexible substrate, wherein the second flexible substrate has a refractive index no more than 0.1 less than a refractive index of a light emitting layer of the organic light emitting diode device region, separately forming a third portion to provide a second flexible barrier system, placing the first portion over the second portion to cover the organic light emitting diode device region, placing a flexible structure to enhance optical outcoupling under the second portion, opposite a side of the second portion to which the first portion is attached, placing the third portion under the flexible structure to enhance optical outcoupling, and providing at least one sealing engagement to sealingly encapsulate the second portion and the flexible structure to enhance optical outcoupling between the first portion and the third portion. The first portion may, for example, be sealed to the third portion to entrap the second portion. In a number of embodiments, the first portion is sealingly attached to the second portion and the third portion is sealingly attached to the second portion.

The foregoing is a summary and thus may contain simplifications, generalizations, and omissions of detail; consequently, those skilled in the art will appreciate that the summary is illustrative only and is not intended to be in any way limiting.

For a better understanding of the embodiments, together with other and further features and advantages thereof, reference is made to the following description, taken in conjunction with the accompanying drawings. The scope of the claimed invention will be pointed out in the appended claims.

DETAILED DESCRIPTION

The method, devices and systems hereof can be used in connection with organic electronic devices generally. In certain embodiments, such organic electronic devices may be flexible or rigid and manufactured in a batch, semi-continuous or continuous process. However, a number of representative embodiments thereof are discussed in connection with representative embodiments of flexible OLEDs formed in a continuous, roll-to-roll process.

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

Early OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
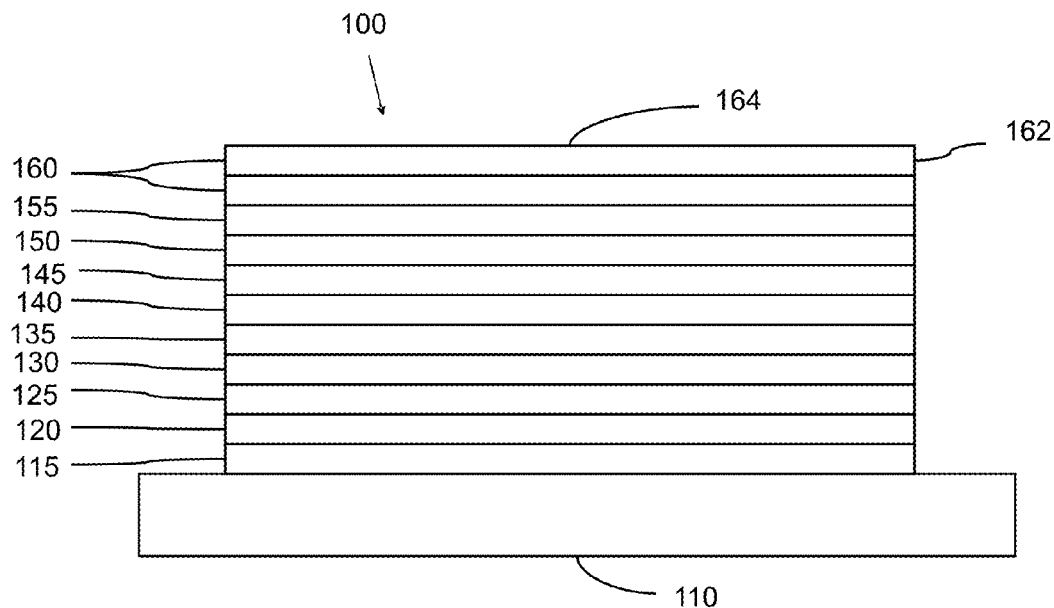
FIG. 1 illustrates schematically an embodiment of organic light emitting device.

FIG. 1 illustrates an embodiment of an organic light emitting device 100. The figures are drawn schematically and are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
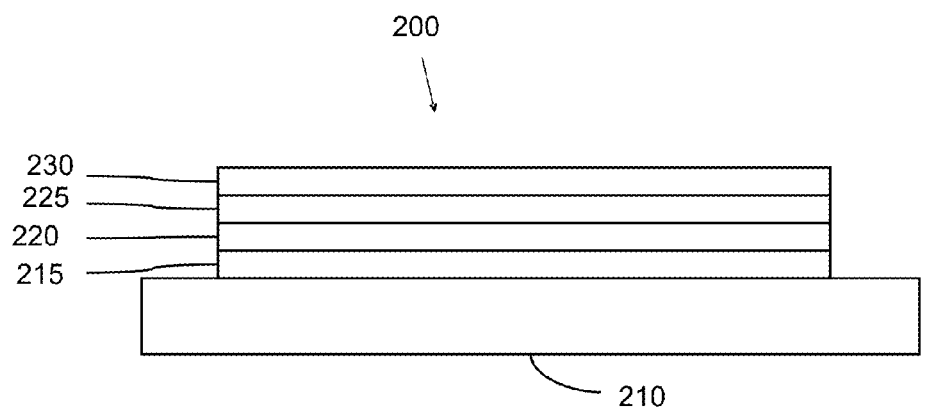
FIG. 2 illustrates schematically an embodiment of an inverted organic light emitting device that does not have a separate electron transport layer.

FIG. 2 illustrates an embodiment of inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides an example of how some layers may be omitted from the structure of device 100.

The simple layered structure illustrated in FIGS. 1 and 2 is provided by way of non-limiting example, and it is understood that embodiments hereof may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although various layers may be described as including a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

OLED Devices may further optionally comprise a barrier layer. One purpose of the barrier layer is to protect the electrodes and organic layers from damaging exposure to harmful species in the environment including oxygen, water vapor and/or other damaging gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. A barrier layer may, for example, comprise a mixture of a polymeric material and a non-polymeric material as described in U.S. Pat. No. 7,968,146, PCT Pat. Application Nos. PCT/US2007/023098 and PCT/US2009/042829, which are incorporated herein by reference in their entireties. To be considered a "mixture", the aforesaid polymeric and non-polymeric materials comprising the barrier layer should be deposited under the same reaction conditions and/or at the same time. The weight ratio of polymeric to non-polymeric material may, for example, be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments hereof may be incorporated into a wide variety of consumer products, including flat panel displays, computer monitors, medical monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the methods hereof, including passive matrix and active matrix. Many of the devices are intended for use in a temperature range comfortable to humans, such as 18 degrees C. to 30 degrees C., and more preferably at room temperature (20-25 degrees C.).

As described above, the materials and structures described herein may have applications in devices (for example, organic electronic devices) other than OLEDs. For example, other optoelectronic devices such as organic solar cells and organic photodetectors may employ the materials and structures. More generally, organic devices, such as organic transistors, may employ the materials and structures.

The terms halo, halogen, alkyl, cycloalkyl, alkenyl, alkynyl, arylkyl, heterocyclic group, aryl, aromatic group, and heteroaryl are known to the art, and are defined in U.S. Pat. No. 7,279,704 at cols. 31-32, which are incorporated herein by reference.

It will be readily understood that the components of the embodiments, as generally described and illustrated in the figures herein, may be arranged and designed in a wide variety of different configurations in addition to the described example embodiments. Thus, the following more detailed description of the example embodiments, as represented in the figures, is not intended to limit the scope of the embodiments, as claimed, but is merely representative of example embodiments.

Reference throughout this specification to "one embodiment" or "an embodiment" (or the like) means that a particular feature, structure, or characteristic described in connection with the embodiment is included in at least one embodiment. Thus, the appearances of the phrases "in one embodiment" or "in an embodiment" or the like in various places throughout this specification are not necessarily all referring to the same embodiment.

Furthermore, the described features, structures, or characteristics may be combined in any suitable manner in one or more embodiments. In the following description, numerous specific details are provided to give a thorough understanding of embodiments. One skilled in the relevant art will recognize, however, that the various embodiments can be practiced without one or more of the specific details, or with other methods, components, materials, et cetera. In other instances, well known structures, materials, or operations are not shown or described in detail to avoid obfuscation.

As used herein and in the appended claims, the singular forms "a," "an", and "the" include plural references unless the context clearly dictates otherwise. Thus, for example, reference to "a layer" includes a plurality of such layers and equivalents thereof known to those skilled in the art, and so forth, and reference to "the layer" is a reference to one or more such layers and equivalents thereof known to those skilled in the art, and so forth.

As described above, OLEDs may find use in a range of applications including, for example, displays, signage decorative lighting, large area flexible illumination, automotive applications and general lighting. In general, it is believed that significant price savings can be achieved in OLED manufacturing using roll-to-roll processing. In that regard, throughput is relatively high in such processes. Moreover, relatively inexpensive metal foils and plastic webs may be used as substrates.

Organic electronic devices, including OLEDs, should be protected from oxygen and water vapor to achieve a long shelf life and long operating lifetime. To achieve a long operating lifetime, it is desirable to encapsulate an OLED before it is exposed to moisture and oxygen. In a number of embodiments hereof, encapsulation is accomplished without breaking vacuum at all, although transfer to a glovebox filled with, for example, a dry, inert gas such as $N_2$ or Ar may be adequate.

Figure 3A:
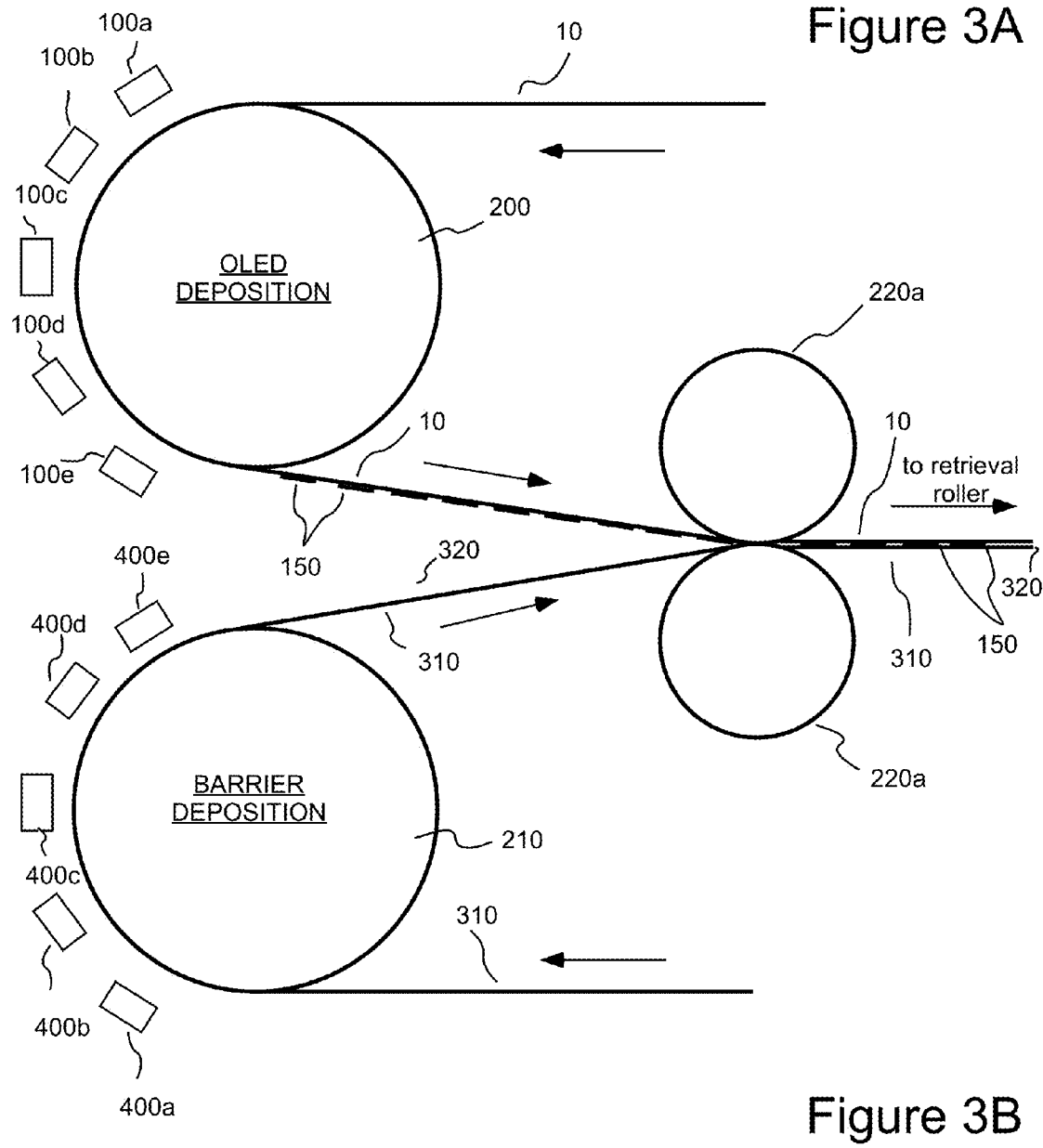
FIG. 3A illustrates schematically the encapsulation of a flexible organic electronic device such as an OLED on a rollcoater.

As described above, however, a limitation of barrier quality is the inability to utilize high energy and/or high temperature processes to, for example, densify the barrier layers without damaging an organic electronic device such as an OLED. In a number of representative embodiments hereof, a continuous process (that is, a process in which the substrates of organic electronic devices hereof are in generally continuous motion) such as a roll-to-roll process is used to form flexible OLEDs. As, for example, illustrated in FIG. 3A, the multiple layers of an OLED are deposited on a flexible substrate 10 using deposition or processing stations 100a, 100b, 100c, 100d, 100e and 100f around, for example, one or more coating drums 200. Flexible substrate 10 is, for example, unwound from a supply roll (not shown). In a number of embodiments, flexible substrate 10 may include a patterned first electrode (for example, including indium tin oxide ITO) deposited thereon. Deposition or processing stations 100a, 100b, 100c, 100d, 100e and 100f may, for example, be sequentially arranged to deposit materials such as: a hole injection layer (HIL), a hole transport layer (HTL), an emissive layer (EML), an electron transport layer ETL, an electron injection layer (EIL) and thin metal such as Al or Ag as a second electrode to form organic electronic device (for example, OLED) regions 150 on flexible substrate 10. As clear to one skilled in the art, fewer or greater deposition/processing stations may be used in a particular embodiment.

To solve the above problem, a moisture and/or oxygen barrier layer or system 320 is deposited on a different flexible substrate 310 using deposition or processing stations 400a, 400b, 400c, 400d and 400e, for example, that are optimized for depositing high quality barrier material around a coating drum 210. The substrate carrying the barrier layer is subsequently placed over the substrate carrying the organic device, without exposure of either substrate to the ambient atmosphere. As clear to one skilled in the art, fewer or greater deposition/processing stations may be used in a particular embodiment.

Barrier system 320 may include a single layer, or multiple layers. Barrier system 320 may be formed by various known physical or chemical vapor deposition techniques and may include compositions having a single phase as well as compositions having multiple phases. Any suitable material or combination of materials may be used for barrier system 320. Barrier system 320 may incorporate an inorganic or an organic compound or both.

Figure 3B:
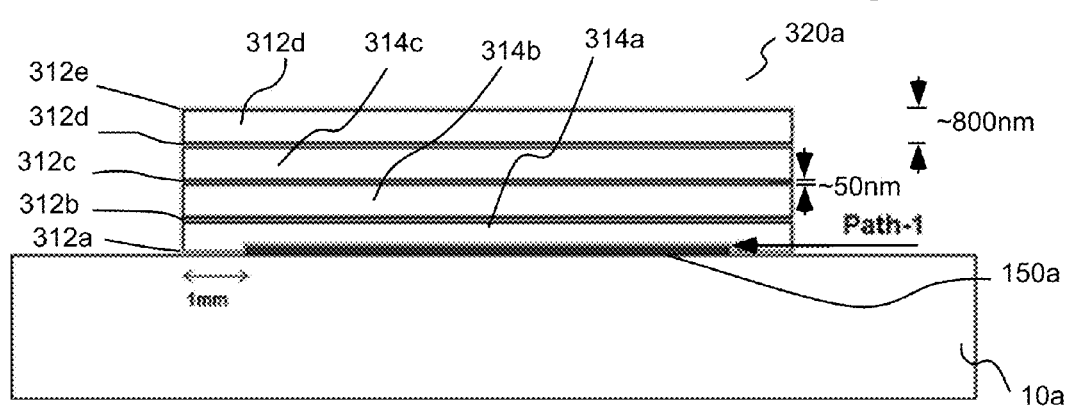
FIG. 3B illustrates schematically a multi-layer barrier system and a path for moisture to reach an organic electronic device such as an OLED therethrough.

FIG. 3B illustrates a multilayer encapsulation barrier system 320a including a 5-layer stack that includes five inorganic layers 312a, 312b, 312c, 312d and 312e (each having a thickness of approximately 50 nm) and four polymer layers 314a, 314b, 314c and 314d (each having a thickness of approximately 800 nm) sandwiched therebetween. Barrier system 320a may provide a direct path (Path-1) for water vapor to travel across a single polymer layer (polymer layer 314a) horizontally to reach organic electronic device 150a (deposited on substrate 10a) by permeating across just one inorganic layer (organic layer 312a). The quality of seal provided by this type of multilayer barrier system is thus mostly dependent on the permeation rate of water vapor across the polymer which can be relatively high. To produce an effective barrier, edge sealing techniques such as described in U.S. Pat. No. 6,866,901, 7,198,832 or 7,727,601, the disclosures of which are incorporated herein by reference, may be employed.

A single layer barrier system may eliminate the above problem because it provides good protection in both vertical and horizontal directions. A single layer barrier system may, for example, include a mixture of a polymeric material and a non-polymeric material as described above and in U.S. Pat. No. 7,968,146, and PCT International Patent Application Nos. PCT/US2007/023098

By forming barrier system 320 separately from OLED regions 150, a set of conditions chosen or optimized for formation of barrier system 320, which are different from the set of conditions used to from OLED regions 150, can be used without concern for damaging OLED regions 150m, any portion thereof or substrate 10. Flexible OLED substrate 10, with OLED regions 150 formed thereon (sometime referred to herein as a second portion), and barrier system 320 (sometimes referred to herein as a first portion) are subsequently laminated together (for example, upon passing through pinch rollers 220a and 220b or other means of applying pressure) without exposure to room ambient using, for example, a flexible face seal and/or an edge seal as described further below.

The resultant product is, therefore, an assembly or composite of a first portion formed of barrier system 320 (formed on barrier substrate 310) and a second portion formed of OLED substrate 10 with OLED regions 150 formed thereon, wherein barrier system 320 encapsulates OLED regions 150. Once again, each element of the assembly or composite may be separately deposited or otherwise formed under conditions uniquely optimized therefor.

In a number of embodiments, first portion/barrier system 320 is placed over the second portion including OLED substrate 10 with OLED regions 150 formed thereon so that the OLED regions 150 are not placed in physical contact with another solid material before placing the first portion over the second portion. Contact of a solid material, surface or object with the various organic layers, electrodes etc. of OLED regions 150 after deposition thereof and prior to overly of a barrier layer or encapsulation can damage delicate OLEDs and other organic electronic devices. For example, winding the flexible substrate onto a retrieval roller can cause significant damage to delicate OLEDs and other organic electronic devices. In that regard, layers are brought into mechanical contact with neighboring layers as a result of winding, which can easily cause damage to the delicate OLED and other organic electronic devices. Further, one particle can cause protrusions in every other layer. Also, relative movement between neighboring layers can also easily cause damage to the OLEDs. Using a protective interleaf layer during winding may reduce some of the damage associated with winding, but not eliminate it. Moreover, contact with the solid surface of the interleaf layer introduces another potential source of damage. Also, an interleaf layer may bring in large particles, causing additional damage. Damage may, for example, also be caused via contact with a tensioning roller and/or with other positioning, tensioning and/or other devices which contact the device side of the substrate.

Placing the first portion/barrier system over the second portion including OLED substrate 10 with OLED regions 150 formed thereon so that the OLED regions 150 are not placed in physical contact with another solid material before placing the first portion over the second portion eliminates the above problems. The first portion provides mechanical protection for the underlying OLED devices. Further, the covered or encapsulated OLED devices are no longer sensitive to following steps or processes in terms of moisture/oxygen exposure. Moreover, as set forth above, covering or encapsulating with the first portion may serve as a barrier layer or coating to limit permeation of, among other things, water vapor and oxygen. As described further below, at least one sealing engagement is formed such that the first portion (for example, in operative connection with substrate 10 and/or another element or component) seemingly encapsulates at least the device side of substrate 10. The degree of impermeability required may differ in different applications. For example, an encapsulation or barrier layer (or other layer exhibiting barrier properties) having a water vapor transmission rate less than a value in the range of approximately $10^{-2}$ g/m$^2$/day to $10^{-6}$ g/m$^2$/day and/or an oxygen transmission rate of less than $10^{-2}$ g/m$^2$/day or less than $10^{-3}$ g/m$^2$/day may be suitable for protecting OLEDs.

The minimum required flexibility of the sealing engagement(s) or seal(s) (for example, effected using adhesives or metal solders as described further below) is, for example, defined by the radius of curvature of the retrieval or take-up roller upon which the assembly is rolled. A higher degree of flexibility may be desirable for flexible display or lighting applications, but relatively rigid products may be made using a rollcoater with an achievable minimum radius of curvature equal to that of the smallest mandrel in the coating system. In a typical rollcoating tool, the mandrels typically do not require a radius of curvature less than about three inches for tensioning or roll up. The appropriate radius for a given system, therefore, defines the minimum radius of curvature of the seal that bonds OLED substrate 10 to barrier substrate 310.

As discussed above, a significant advantage of the systems and methods hereof is the decoupling of the OLED deposition from the barrier deposition in a continuous, roll-to-roll process. Such decoupling occurs regardless of whether OLED regions 150 are deposited at the same time as barrier system 320 is formed, but on different drums, or whether barrier system 320 is formed in an entirely different system separate from the OLED deposition system and combined at a later time. In a number of embodiments, however, barrier system 320 and substrate 10 with OLED regions 150 formed thereon are combined without exposing either one to a humid environment (for example, either by direct vacuum transfer or by transfer in an inert gas environment).

Figure 4:
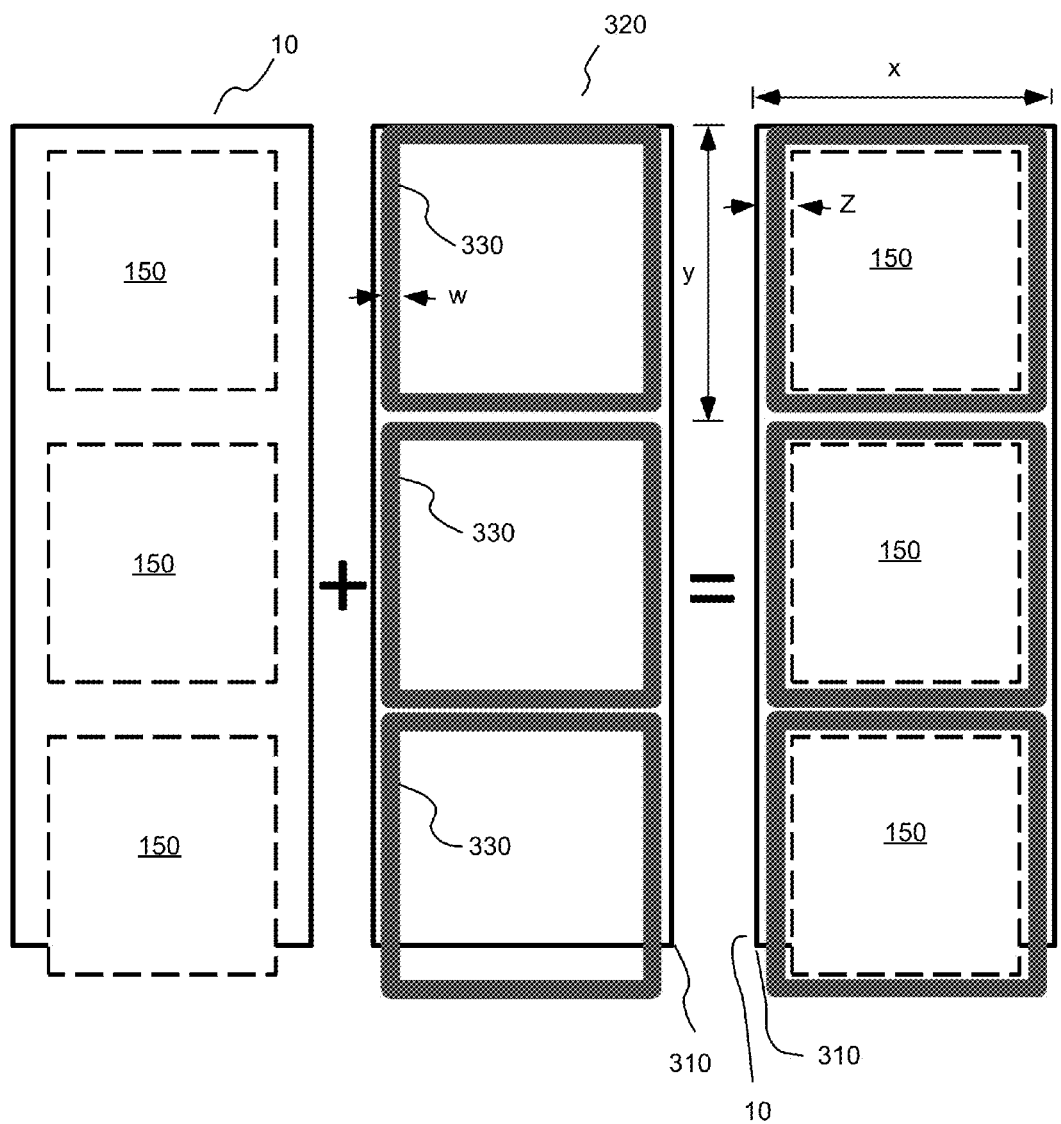
FIG. 4 illustrates schematically a method for applying an edge seal (either with or without a face seal) to a flexible organ electronic device such as an OLED manufactured in a roll-to-roll process.

As described above, in a number of embodiments OLED regions or layer structures 150 are deposited on continuous substrate 10 with pre-patterned electrodes. Spaced OLED regions 150 are patterned in such a manner that after completion of the assembly as described above, the resultant continuous roll can be cut into separate OLED devices or systems (or other organic electronic devices or systems), wherein each OLED or other device or system has a determined outer perimeter. An OLED device or system may, for example, include a single OLED device region 150 or a plurality or array of OLED device regions 150. In an example of OLED device or system having a rectangular perimeter, individual OLED devices or system may, for example, be x mm wide by y mm long (see, for example, FIG. 4). This patterning may, for example, be accomplished via ink-jet printing, organic vapor jet printing or vacuum deposition using a shadow mask. In the latter case, a separate loop of shadow masks may be configured to travel with OLED substrate 10, or a step and repeat deposition system may be employed, with an accumulator stage on either side of the vacuum deposition zone and a static shadow mask indexed to the substrate in the stationary zone. As described above, a barrier layer or layers (for example, one or more moisture barrier layers) may be uniformly deposited on barrier substrate 310 (on a separate rollcoating drum) by methods optimized for barrier integrity, which may involve high temperature (for example, a temperature above a glass transition temperature of at least one layer of OLED region 150 and/or substrate 10) and/or plasma exposure.

In a number of embodiments, after formation of barrier system 320 (including, for example, deposition of one or more barrier layers), a thin face seal is applied to barrier system 320 such that the entire surface of barrier system 320 to be attached to substrate 10 is generally uniformly coated. A system, including, for example, a set of pinch rollers 220a and 220b, may, for example, be subsequently used to apply pressure and laminate barrier system 320 to the device face or surface of OLED substrate 10. Application of pressure may continue while curing the face seal. In a representative embodiment, the face seal adhesive may, for example, be a flexible epoxy. In a number of embodiments, the face seal material may, for example, be loaded with a material (for example, a particulate material) to inhibit moisture conduction or transport therethrough. For example, a powder or nanoscale clay material may be included in the face seal material to inhibit lateral transport of moisture into the composite product. In that regard, clay platelets are known to create a tortuous path for moisture thereby reducing the permeation rate. See, for example, L. E. Neilson, J. Macromol. Sci. (Chem.), A1(5), 929-942 (1967), the disclosure of which is incorporate herein by reference. Moisture permeation rates as low as $10^{-2}$ g/m$^2$/day have been demonstrated in such systems. In a number of embodiments, the deposition of OLED region 150 is restricted to have a perimeter less than the perimeter of the final cut device (for example, restricted to have a width <x mm and a length <y mm) so that the face seal encapsulation extends beyond the edge of OLED region 150.

In other representative embodiments, OLED region 150 is deposited on pre-patterned continuous substrate 10 in such a manner that after completion, the individually cut OLED devices include a width of flexible substrate between an outer perimeter of the OLED device region(s) 150 and the outer perimeter of the individual systems (including one or more OLED regions 150 as described above). For example, with reference to FIG. 4, the continuous roll may be cut into generally rectangular individual devices x mm wide by y mm long with z mm of bare substrate between the edge of the OLED pattern/OLED region 150 and the edge of substrate 10. As described above, barrier system 320 is uniformly formed separately (for example, on a separate rollcoating drum). After formation of barrier system 320, a relatively thin edge seal 330 (for example, an epoxy) of a width w may be applied to barrier system 320. Width w is, for example, determined such that the outer edge of edge seal 330, after compression, will be approximately x mm by approximately y mm and the width of the seal will be less than z mm, where x and y are, once again the dimensions of the final cut product. This process prevents the seal material from contacting the perimeter of OLED region 150, from where it may diffuse laterally into the active device region. Edge seal 330 may, for example, be patterned by printing, embossing, imprint lithography or extrusion. Pinch rollers 220a and 220b may subsequently laminate the barrier face or surface of barrier system 320 to the device face of OLED substrate 10. Once again, application of pressure can continue while curing edge seal 330.

Figure 5:
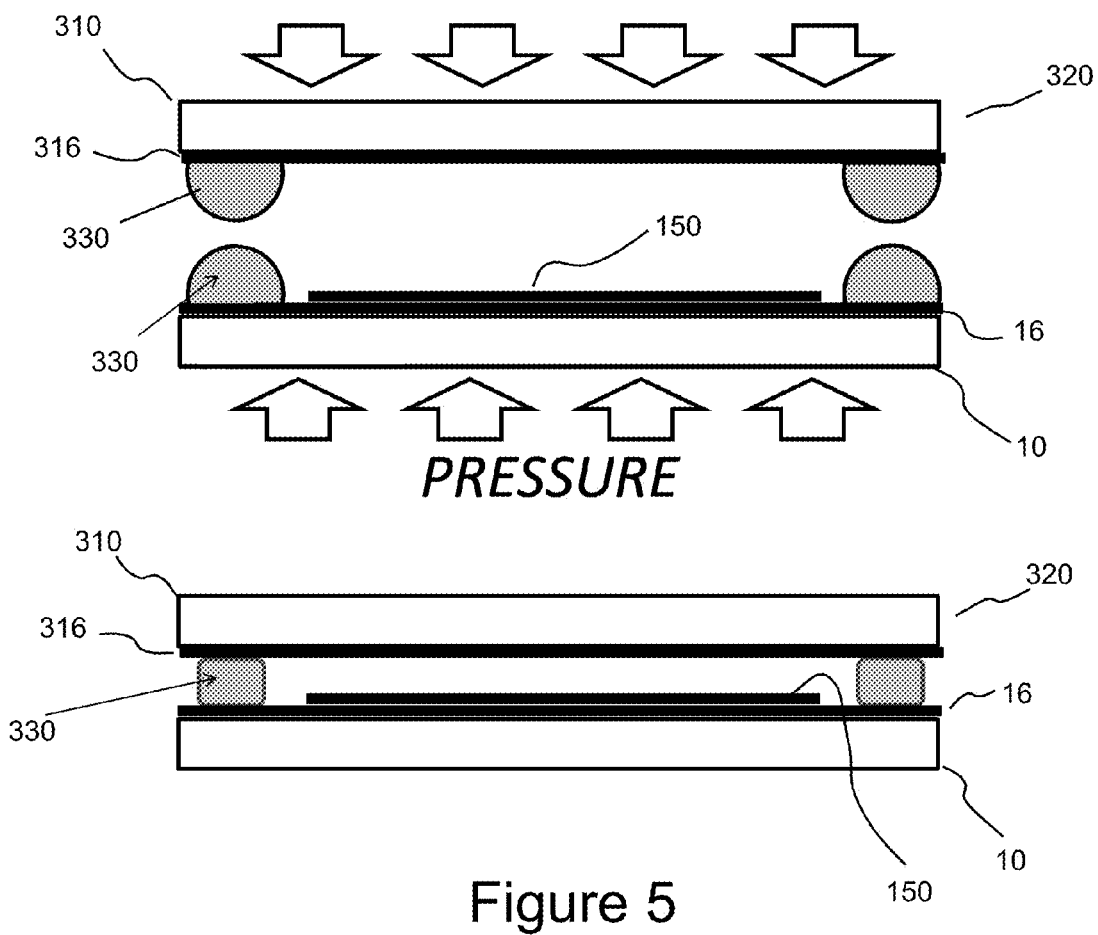
FIG. 5 illustrates schematically a side view of an edge-sealed organic electronic device including a moisture barrier substrate in a disassembled or exploded state (top) and in an assembled state (bottom).

FIG. 5 illustrates a side view of an edge-sealed OLED or other organic electronic device formed by the process described above. In FIG. 5, however, an edge seal material 330 is applied to each of the first portion formed by barrier system 320 and the second portion formed by substrate 10 and OLED region 150 formed thereon. In the illustrated embodiment, barrier system 320 includes a moisture barrier 316 formed on substrate 310. Substrate 10 also included a moisture barrier 16. A top section of FIG. 5 illustrates an exploded or disassembled view, while a bottom section of FIG. 5 illustrates an assembled view after application of pressure and curing of edge seal material 330.

Pinch rollers 220a and 220b may, for example, be transparent to ultraviolet radiation to allow for UV curing. In a number of embodiments, pinch rollers 220a and 220b may be subdivided into two, spatially separated pinch rollers with UV irradiation in between the two sets of rollers. Pinch rollers 220a and 220b may further be heated. Edge seal 330 (for example, an epoxy) may be loaded with nanoclays or other moisture inhibiting materials as described above.

Both a face seal and an edge seal may, for example, be used. The face seal and the edge seal may, for example, be applied sequentially. The face seal serves to improve the integrity of the composite whereas the edge seal limits the lateral permeation of moisture into the composite package.

Examples of face-seal materials include ARclean™ and ARclad® low-out-gassing adhesives available from Adhesives Research, Inc., Glen Rock, Pa.; Ultra-Clean Laminating Adhesive 501FL and Optically Clear Laminating Adhesive 8141, both available from 3M Bonding Systems Division, St. Paul, Minn.; and 1034-series adhesives available from Craig Adhesives and Coatings Company, of Newark, N.J. Examples of edge seal materials include metal solder seals such as indium, indium-tin eutectic, and other low melting point metals. If a metal solder seal is used, an adhesion layer may be desirable to produce a strong composite. Examples of adhesion layers include chromium and nickel. If a metal solder seal is used, then a dielectric layer should also be applied between the solder seal and any electrodes which may pass through the seal to connect the OLEDs to external circuitry. Examples of the dielectric layer include SiNx, SiOx, SiC or polymeric materials. In the latter case, the polymer must be stable beyond the melting point of the metal. Other examples of sufficiently flexible edge seal materials include various epoxy resins. For example, Addison Clearwave of St. Charles, Ill. makes an epoxy specifically formulated for flexible OLED applications, AC A1429-F1 Flexible Sealant for Flexible OLED Devices. Alternatively, Epoxy Technology Inc. of Billerica, Mass. produces a product EPO-TEK® OG142 that is specifically formulated for OLED sealing applications.

Furthermore, a UV-curable epoxy layer as a planarizing buffer on an OLED substrate is described L. Hui et al., "Flexible Organic Light-Emitting Diodes with Improved Performance by Insertion of an UV-Sensitive Layer", J. Vac. Sci. Technol. B 26, 1379 (2008), the disclosure of which is incorporated herein by reference. The resulting OLED was bent more than 50 times to a 20 mm radius of curvature without damage. Such a range of flexibility is more than adequate flexibility for rollcoating applications described herein. Edge seal materials may also be loaded with nanoclays or nanoparticles to further reduce moisture permeation. In a number of embodiments, the edge seal has a width of at least 1 mm or even at least 1 cm to minimize lateral permeation.

To optimize the flexibility of the composite and to minimize the lateral moisture permeation into OLED region 150, the thickness of both a face seal and an edge seal should be minimized. In a number of embodiments using epoxy resin as the sealant, the thickness of the sealing layer is no more than 100 um, no more than 10 um, or even no more than 5um. Simple calculations demonstrate that one can achieve a good edge seal using available materials. In that regard, the permeation rate through a barrier is described by (mass transfer rate)=(permeability)×(area)×(partial pressure difference). Although the permeability may depend on the film thickness, moisture permeation tends to be dominated by diffusion through defects and so this dependence can be weak and complex. An edge seal may, for example, be defined to be "sufficient" when the permeation rate through it is less than the permeation rate through the two faces of the moisture barrier substrate and encapsulation. Indeed, improving the edge seal beyond that level provides diminishing rewards, because the operating lifetime will then be limited by diffusion through the face of the substrate and encapsulation film. For a square device of length x, the total permeation area of substrate and encapsulation film is $2 \cdot x^2$. If the edge seal is compressed to thickness T, the total permeation area of the edge seal is $4 \cdot x \cdot T$. The ratio of edge seal area to face seal area is therefore $4 \cdot x \cdot T/2 \cdot x^2$ or $2 \cdot T/x$. Novel "ultrabarrier" substrates have provided moisture permeation rates of $10^{-6}$ g/m²/day. Simple, clay-loaded epoxy composites, on the other hand, provide permeation rates of $10^{-2}$ g/m²/day. Using the former as a barrier substrate and the latter as an edge seal, therefore, the face seal will limit operating lifetime if $2 \cdot T/x < 10^{-2}/10^{-6}$, or $2 \cdot T < 10^{-4} x$. For a 1 m (39 inch) device, then, $T < 5 \times 10^{-5}$ m or 50 um.

Smaller devices will typically require thinner edge seals to achieve this limit, but this simple representative estimate shows that viable edge seals are achievable with known technology.

As described above, a curing mechanism may be ultraviolet light and/or heat. The curing mechanism may be locally applied to the seal/adhesive globally applied to the entire substrate. In a number of embodiments, a pressurizing mechanism or mechanisms such as pinch rollers 220a and 220b apply pressure only at the edge of the substrates, causing an edge seal. In other embodiments, pinch rollers 220a and 220b apply pressure across the entire substrate, resulting in a face seal. Pinch roller 220a and 220b may also apply pressure across the entire substrate with more pressure and/or a curing mechanism around the edge region, resulting in a face seal with a reinforcing edge seal. Other pressurizing systems such as a presses or reciprocating stamps that distribute uniform pressure around the seal may be used. In the case of a metal solder seal, heat is required to melt the solder. Heat may, for example, be directly applied by conduction from a hot surface or indirectly applied via, for example, illumination of the solder line with a laser.

In a number of embodiments, the barrier substrate may, for example, be a thin metal foil rather than a plastic substrate. The metal foil may be directly laminated to the OLED using either a face seal or edge seal. A dielectric layer may be required to prevent shorting of the top electrode of the OLED and/or electrical leads/contacts extending from OLED device regions 150. The dielectric layer may, for example, be an inorganic material such as $SiN_x$, $SiO_x$, $SiO_xC_{2-x}$, SiC, $Al_2O_x$ or related materials, or an organic layer such as a cured epoxy, acrylic or other non-conductive carbon-based material. The dielectric layer should be free of pinhole defects that would allow the metal solder seal to contact the OLED electrode leads.

Figure 6:
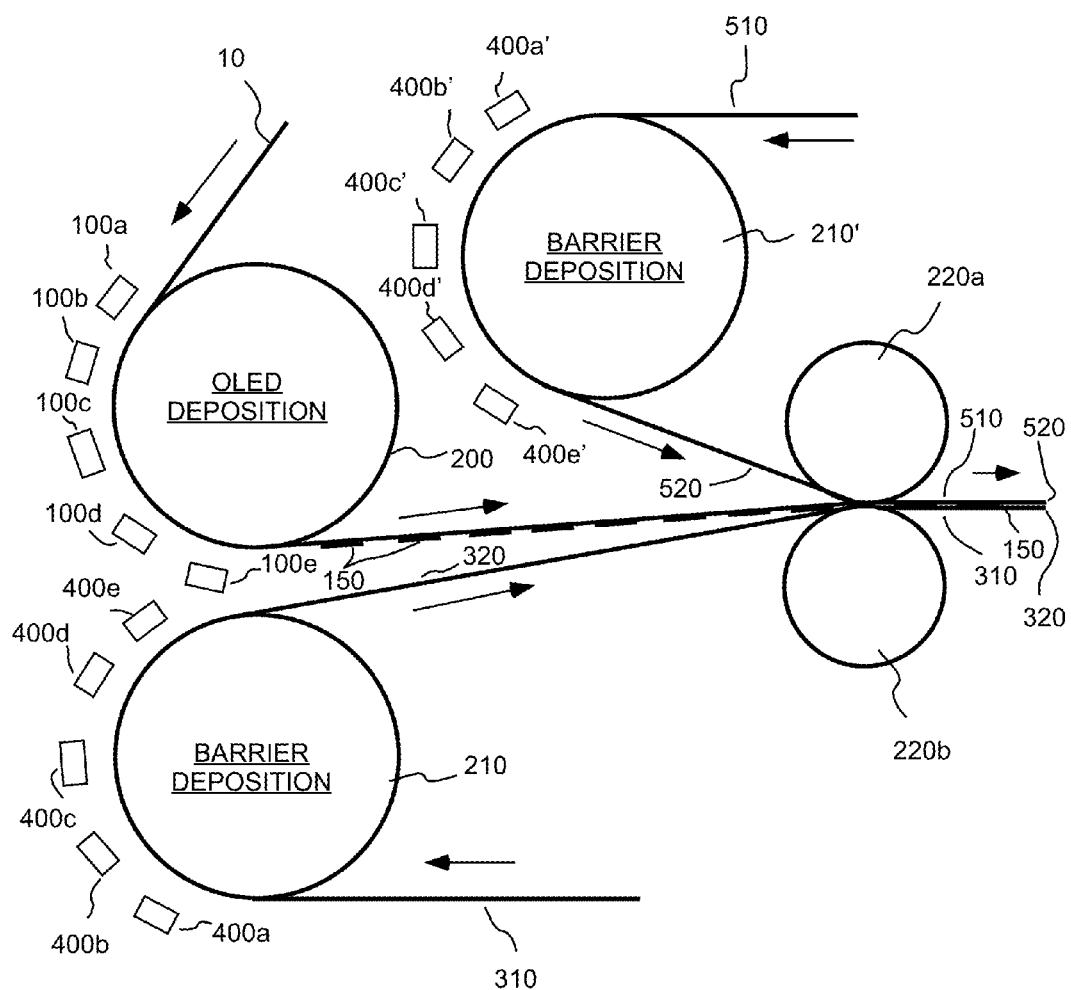
FIG. 6 illustrates schematically the double encapsulation of a flexible organic electronic device such as an OLED on a rollcoater.

FIG. 6 illustrates a representative embodiment of double encapsulation of a flexible organic electronic device such as an OLED on a rollcoater. In such embodiments, OLED region 150 may be formed on substrate 10 which has no significant or insufficient barrier properties (for example, polypropylene) as described above. For example, such a substrate may have a water vapor transmission rate of greater than a value in the range of $10^{-2}$ g/m²/day to $10^{-6}$ g/m²/day and/or an oxygen transmission rate of greater than $10^{-2}$ g/m²/day or greater than $10^{-3}$ g/m²/day may be suitable for protecting OLEDs. Once again, upper limits upon permeability or transmission rate may differ in differing uses/devices. The OLED substrate may, for example, be optimized for any number of properties (for example, optical outcoupling) without consideration of barrier properties. For example, many potential high-index substrates have poor barrier properties and/or a glass transition temperature that is too low to permit deposition of a good barrier film thereon. Barrier system 320 is formed and placed over the device surface of OLED substrate 10 as described above. Another barrier system 520 (or third portion) is placed under the surface of OLED substrate 10 opposite the device surface. Barrier system 520 includes, for example, a flexible substrate 510 upon which one or more barrier layers are deposited via deposition or process stations 400a', 400b', 400c', 400d' and 400e', for example, around a coating drum 210'. As clear to one skilled in the art, fewer or greater deposition/processing stations may be used in a particular embodiment. Subsequent to deposition of each of the three portions of the system as described above, the three portions may, for example, be laminated together. This process provides a number of advantages including: (i) the OLED, its electrodes and any integrated drive electronics are close to the neutral bend plane of the composite structure, thereby minimizing strain on the active electronic components when the composite is bent and (ii) the OLED substrate is relieved of any barrier-deposition requirements which may help in choosing a very low cost or otherwise optimized material. In the embodiment of FIG. 6, barrier systems 320 and 520 may, for example, be seemingly attached to one another (via, for example, an edge seal), capturing substrate 10 and OLED region 150 formed thereon without being sealed/adhered thereto. Alternatively, one or both of barrier systems 320 and 520 may also be sealed/adhered to substrate 10.

Figure 7:
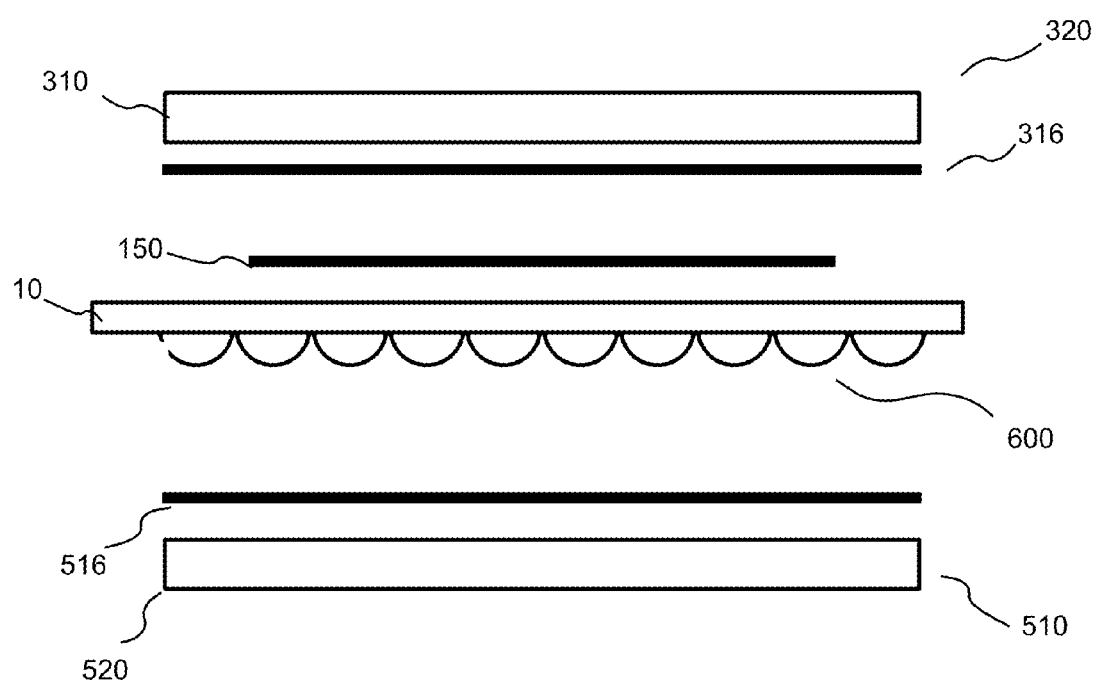
FIG. 7 illustrates a side, exploded or disassembled schematic view of doubly encapsulated organic electronic device such as an OLED including a microlens array or other outcoupling enhancement on the organic electronic device substrate.
Figure 8:
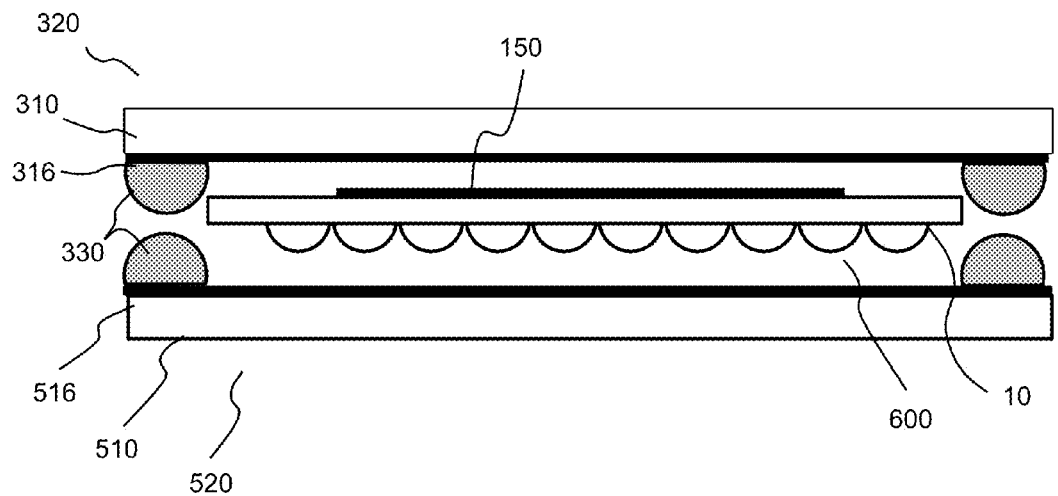
FIG. 8 illustrates a side, partially assembled schematic view of the device of FIG. 7.
Figure 9:
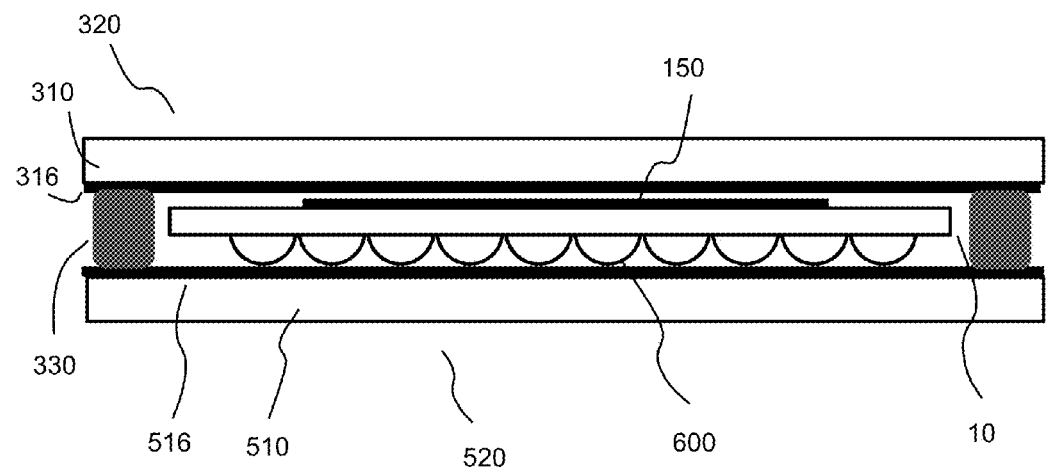
FIG. 9 illustrates side, fully assembled schematic view of the device of FIG. 7.

As, for example, illustrated in FIGS. 7 through 9, in a number of embodiments, OLED substrate 10 may carry a structure 600 to enhance optical outcoupling on a side opposite the device side (that is, the side upon which OLED regions 150 are formed) of substrate 10. Substrate 10 and outcoupling structure 600 may, for example, have a refractive index no more than 0.1 less than a light emitting layer of OLED region 150, thereby coupling substantially all the light out of the light emitting structure. For example, in the case of a light emitting layer having a refractive index of 1.8, outcoupling structure 600 should have a refractive index no less than 1.7. In a number of embodiments, substrate 10 and outcoupling structure 600 have a refractive index greater than the refractive index of the light emitting layer of OLED region 150. Similar to moisture barrier layer 316 of barrier system 320, barrier system 520 also includes a moisture barrier layer 516 in the illustrated embodiment.

Figure 10:
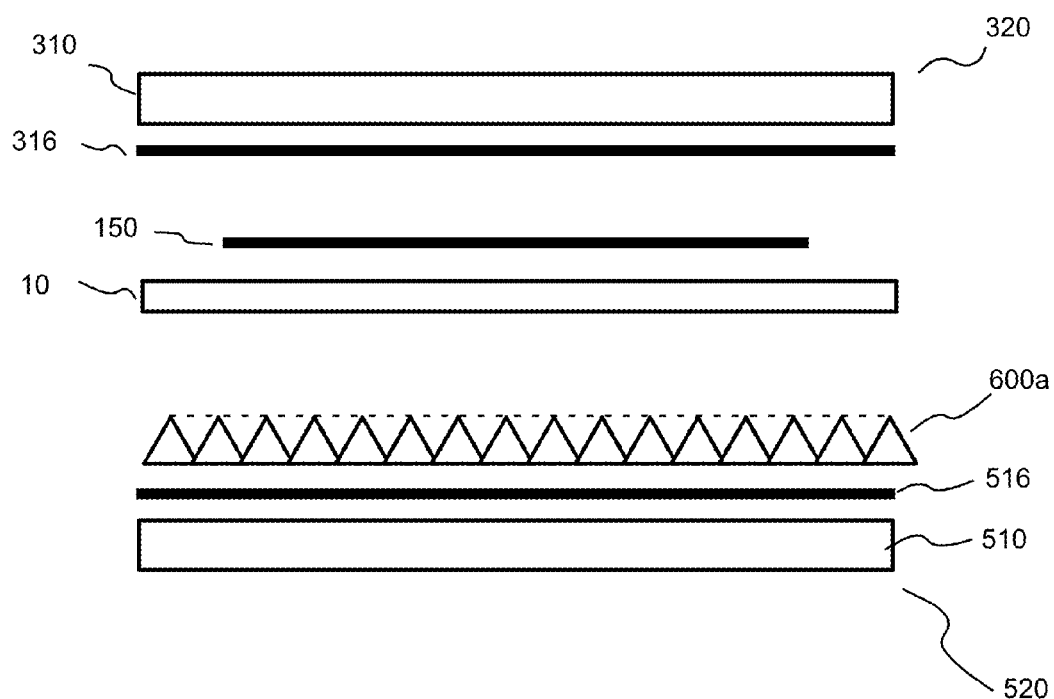
FIG. 10 illustrates a side, exploded or disassembled schematic view of a doubly encapsulated organic electronic device such as an OLED wherein an outcoupling enhancement may be applied to the organic electronic device side of one of the moisture barrier substrates.
Figure 11:
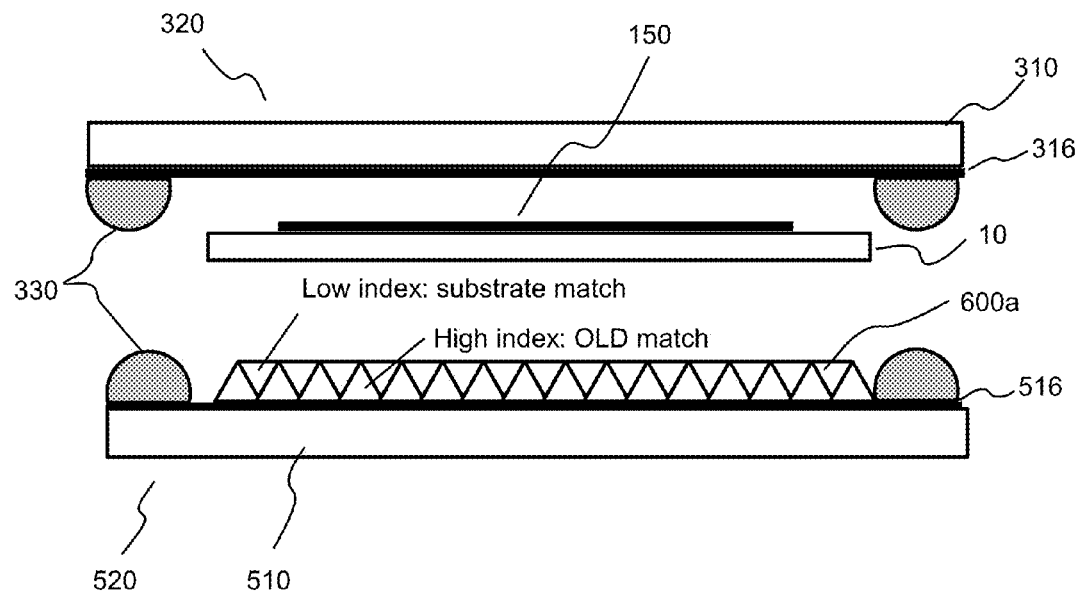
FIG. 11 illustrates a side, exploded or disassembled schematic view of the device of FIG. 10 with an outcoupling enhancement applied to the bottom moisture barrier substrate.
Figure 12:
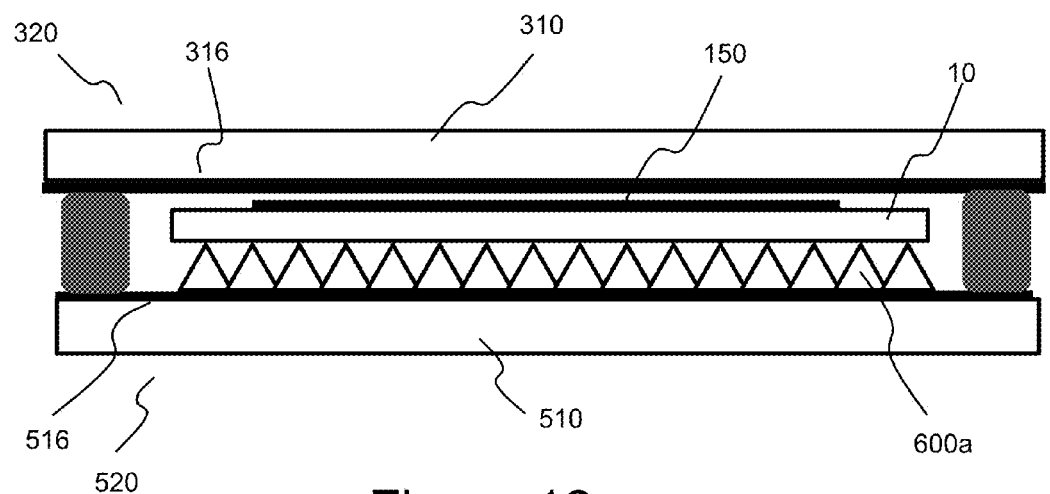
FIG. 12 illustrates a side, fully assembled schematic view of the device of FIG. 11.

In a number of other embodiments, as illustrated, for example, in FIGS. 10 through 12, substrate 510 of underside barrier system 520 carries an additional optical outcoupling layer or structure 600a on top of moisture barrier layer or structure 516 thereof. The refractive index of barrier substrate 510 and optical outcoupling structure 600a may, for example, be higher than the light emitting layer of OLED region 150, thereby outcoupling substantially all of the light from OLED region 150.

In a number of embodiments, the surface of substrate 10 may be adapted to provide outcoupling (for example, to provide a refractive index as described above in connection with outcoupling structure 600). For example, the surface of substrate 10 may be embossed or otherwise textured to provide outcoupling.

This disclosure has been presented for purposes of illustration and description but is not intended to be exhaustive or limiting. Many modifications and variations will be apparent to those of ordinary skill in the art. The example embodiments were chosen and described in order to explain principles and practical application, and to enable others of ordinary skill in the art to understand the disclosure for various embodiments with various modifications as are suited to the particular use contemplated.

Thus, although illustrative example embodiments have been described herein with reference to the accompanying figures, it is to be understood that this description is not limiting and that various other changes and modifications may be affected therein by one skilled in the art without departing from the scope or spirit of the disclosure.

What is claimed is:

1. A method of making a flexible organic electronic device, comprising:
   forming a first portion comprising a first flexible substrate, the first portion being formed under a first set of conditions to provide a barrier system;
   separately forming a second portion comprising at least one organic electronic device region deposited upon a second flexible substrate, the second portion being formed under a second set of conditions, different from the first set of conditions; and
   placing the first portion over the second portion to cover the organic electronic device region;
   wherein the organic electronic device region is not placed in physical contact with another solid material before placing the first portion over the second portion; and
   wherein the organic electronic device region is deposited upon the second flexible substrate and the first portion is placed over the second portion in the same vacuum chamber.

2. The method of claim 1 wherein the organic electronic device region is formed in a roll-to-roll process.

3. The method of claim 2 wherein the first portion is placed over the second portion in a roll-to-roll process.

4. The method of claim 3 wherein there is no winding of the second portion around a roller before the first portion is placed over the second portion.

5. The method of claim 1 wherein the first portion is in motion and the second portion is in motion when the first portion is placed over the second portion.

6. The method of claim 1 wherein the second flexible substrate is a metal foil.

7. The method of claim 1 wherein the second flexible substrate comprises a barrier coated polymer.

8. The method of claim 1 wherein the organic electronic device region further comprises a top protective layer.

9. The method of claim 1 wherein there is no exposure of the first portion to ambient atmosphere between the time of formation thereof and a time of placing the first portion over the second portion and forming a sealing encapsulation of the organic electronic device region.

10. The method of claim 1 wherein the first portion and the second portion are transported for placing the first portion over the second portion in an inert atmosphere.

11. The method of claim 1 wherein the first portion and the second portion are transported for placing the first portion over the second portion in a vacuum.

12. The method of claim 1 wherein the organic electronic device region is deposited upon the second flexible substrate and the first portion is placed over the second portion without breaking vacuum.

13. The method of claim 1 wherein at least one condition of the first set of conditions would damage at least one layer of the organic electronic device region.

14. The method of claim 13 wherein the first set of conditions includes at least one of a high energy condition, an oxidative condition or a high temperature condition.

15. The method of claim 14 wherein a temperature condition of the first set of conditions exceeds a temperature 10 degrees below the glass transition temperature of at least one organic material of the second portion.

16. The method of claim 14 wherein formation of the first portion includes a plasma process.

17. The method of claim 1 wherein a plurality of spaced organic electronic device regions are deposited on the second flexible substrate such that the first portion and second portion can be cut to form individual organic electronic devices, each of the individual organic electronic devices having a determined outer perimeter.

18. The method of claim 17 further comprising applying a face seal over a surface of the first portion to be attached to the second portion so that substantially the entire surface of the first portion to be attached to the second portion is covered generally uniformly by the face seal.

19. The method of claim 18 wherein attaching the first portion to the second portion comprises applying pressure.

20. The method of claim 19 further comprising curing the face seal.

21. The method of claim 19 wherein the face seal comprises a flexible adhesive or a metal solder.

22. The method of claim 21 wherein the flexible adhesive comprises a flexible epoxy.

23. The method of claim 18 wherein the face seal comprises particles to inhibit moisture conduction.

24. The method of claim 18 wherein the face seal has a thickness no greater than 100 μm.

25. The method of claim 17 wherein the individual organic electronic devices comprise a width of flexible substrate between an outer perimeter of the at least one organic electronic device region and the outer perimeter of the individual organic electronic devices.

26. The method of claim 25 further comprising applying an edge seal having a determined width to the first portion, wherein the determined width of the edge seal applied to the first portion is determined such that, after attachment of the first portion to the second portion, an inner perimeter of the edge seal does not contact the organic electronic device region of the individual organic electronic devices.

27. The method of claim 26 wherein attaching the first portion to the second portion comprises applying pressure.

28. The method of claim 27 further comprising curing the edge seal.

29. The method of claim 26 wherein the edge seal comprises a flexible adhesive or a metal solder.

30. The method of claim 29 wherein the edge seal comprises a flexible epoxy.

31. The method of claim 29 wherein the edge seal comprises a low melting point metal solder.

32. The method of claim 31 wherein the edge seal comprises indium or a eutectic mixture of indium with another metal.

33. The method of claim 26 wherein the edge seal comprises particles to inhibit moisture conduction.

34. The method of claim 26 wherein the edge seal has a thickness no greater than 100 μm.

35. The method of claim 1 wherein the first portion comprises a thin metal layer.

36. The method of claim 35 further comprising placing a dielectric layer between the thin metal layer and the organic electronic device region.

37. The method of claim 1 wherein the flexible organic electronic device is a flexible organic light emitting diode device.

38. The method of claim 1 wherein the first portion comprises a single layer barrier.

39. The method of claim 1 further comprising:
    forming a third portion comprising a third flexible substrate, the third portion being formed under a third set of conditions, which are different from the second set of conditions, to provide a barrier system; and
    sealing the first portion to the third portion to entrap the second portion therebetween.

40. The method of claim 39 wherein the second portion exhibits insufficient barrier properties.

41. The method of claim 1 wherein the first portion comprises a single barrier layer on the first flexible substrate.

42. The method of claim 1 further comprising applying a face seal over a surface of the first portion to be attached to the second portion so that substantially the entire surface of the first portion to be attached to the second portion is covered generally uniformly by the face seal.

43. The method of claim 42 wherein attaching the first portion to the second portion comprises applying pressure.

44. The method of claim 43 further comprising curing the face seal.

45. The method of claim 1 further comprising applying an edge seal having a determined width to the first portion, wherein the determined width of the edge seal applied to the first portion is determined such that, after attachment of the first portion to the second portion, an inner perimeter of the edge seal does not contact the organic electronic device region.

46. The method of claim 45 wherein attaching the first portion to the second portion comprises applying pressure.

47. The method of claim 46 further comprising curing the edge seal.

48. A method of making a flexible organic light emitting device, comprising:
    forming a first portion comprising a first flexible substrate, the first portion being formed under a first set of conditions to provide a barrier system;
    separately forming a second portion comprising at least one organic electronic device region deposited upon a second flexible substrate, the second portion being formed under a second set of conditions, different from the first set of conditions;
    placing the first portion over the second portion to cover the organic electronic device region;
    forming a third portion comprising a third flexible substrate, the third portion being formed under a third set of conditions, which are different from the second set of conditions, to provide a barrier system;
    placing the third portion under the second portion, opposite a side of the second portion to which the first portion is positioned, wherein there is no exposure of the second portion to ambient atmosphere between the time of formation thereof and the time the third portion is placed thereunder;
    placing a flexible structure to enhance optical outcoupling between the organic electronic device region and the third portion, the flexible structure comprising a microlens array,
    wherein the organic electronic device region is not placed in physical contact with another solid material before placing the first portion over the second portion.

49. The method of claim 48 wherein the microlens array is formed using the same material as the second substrate.

50. The method of claim 48 wherein the flexible structure to enhance optical out-coupling is formed with at least one material having a refractive index not more than 0.1 less than a refractive index of a light-emitting layer of the organic electronic device region.

51. The method of claim 48 wherein the flexible structure to enhance optical out-coupling is formed with at least one material having a refractive index greater than a refractive index of a light-emitting layer of the organic electronic device region.

52. The method of claim 48 wherein the flexible organic electronic device is a flexible organic light emitting diode device and the method further comprises modifying the substrate to enhance outcoupling thereof.

53. A method of making a flexible organic light emitting diode device, comprising:
- forming a first portion to provide a first flexible barrier system;
- separately forming a second portion comprising at least one organic light emitting diode device region deposited upon a second flexible substrate, wherein the second flexible substrate has a refractive index no more than 0.1 less than a refractive index of a light emitting layer of the organic light emitting diode device region;
- separately forming a third portion to provide a second flexible barrier system;
- placing the first portion over the second portion to cover the organic light emitting diode device region;
- placing a flexible structure to enhance optical outcoupling under the second portion, opposite a side of the second portion to which the first portion is attached;
- placing the third portion under the flexible structure to enhance optical out-coupling, and
- providing at least one sealing engagement to sealingly encapsulate the second portion and the flexible structure to enhance optical out-coupling between the first portion and the third portion.

54. The method of claim 53 wherein the first portion is sealed to the third portion to entrap the second portion.

55. The method of claim 54 wherein the first portion is sealingly attached to the second portion and the third portion is sealingly attached to the second portion.

* * * * *